(12) United States Patent
Beinglass

(10) Patent No.: US 7,732,353 B2
(45) Date of Patent: Jun. 8, 2010

(54) METHODS OF FORMING A DENUDED ZONE IN A SEMICONDUCTOR WAFER USING RAPID LASER ANNEALING

(75) Inventor: Israel Beinglass, Sunnyvale, CA (US)

(73) Assignee: Ultratech, Inc., San Jose, CA (US)

( * ) Notice: Subject to any disclaimer, the term of this patent is extended or adjusted under 35 U.S.C. 154(b) by 459 days.

(21) Appl. No.: 11/788,192

(22) Filed: Apr. 18, 2007

(65) Prior Publication Data

US 2008/0258302 A1 Oct. 23, 2008

(51) Int. Cl.
*H01L 21/00* (2006.01)
(52) U.S. Cl. .................. 438/795; 257/E21.328
(58) Field of Classification Search .......... 438/795; 257/E21.328
See application file for complete search history.

(56) References Cited

U.S. PATENT DOCUMENTS

| | | | | |
|---|---|---|---|---|
| 4,376,657 A * | 3/1983 | Nagasawa et al. | ........... | 438/402 |
| 4,734,550 A * | 3/1988 | Imamura et al. | ....... | 219/121.77 |
| 5,956,603 A | 9/1999 | Talwar et al. | ............ | 438/520 |
| 6,300,208 B1 | 10/2001 | Talwar et al. | ............ | 438/308 |
| 6,366,308 B1 | 4/2002 | Hawryluk et al. | ........... | 347/256 |
| 6,531,681 B1 | 3/2003 | Markle et al. | ............ | 219/121.8 |
| 6,747,245 B2 | 6/2004 | Talwar et al. | ............ | 219/121.8 |
| 7,098,155 B2 * | 8/2006 | Talwar et al. | ............... | 438/795 |
| 7,157,660 B2 | 1/2007 | Talwar et al. | .......... | 219/121.63 |
| 7,374,955 B2 * | 5/2008 | Izumome | ....................... | 438/4 |
| 7,422,775 B2 * | 9/2008 | Ramaswamy et al. | ....... | 427/572 |
| 2003/0054641 A1 * | 3/2003 | Binns et al. | ................. | 438/689 |
| 2005/0045604 A1 | 3/2005 | Talwar et al. | .......... | 219/121.65 |
| 2005/0205110 A1 * | 9/2005 | Kao et al. | ..................... | 134/1.1 |
| 2006/0193032 A1 * | 8/2006 | Aso et al. | .................... | 359/330 |
| 2008/0026597 A1 * | 1/2008 | Munro et al. | ................ | 438/788 |

OTHER PUBLICATIONS

SEMI M1-1106, "Specifications for Polished Monocrystalline Silicon Wafers", 1978, 2006.

* cited by examiner

*Primary Examiner*—Trung Dang
(74) *Attorney, Agent, or Firm*—Allston L. Jones; Peters Verny, LLP

(57) ABSTRACT

Methods for forming a denuded zone in an oxygen-containing semiconductor wafer using rapid laser annealing (RLA) are disclosed. The method includes scanning an intense beam of laser radiation over the surface of the wafer to raise the temperature of each point on the wafer surface to be at or near the wafer's melting temperature for a time period on the order of a millisecond or so. This rapid heating and cooling causes oxygen in the wafer near the wafer surface to diffuse out from the wafer surface. Oxygen in the body of the wafer remains unheated and thus does not diffuse toward the wafer surface. The result is an oxygen-depleted zone—called a "denuded zone"—formed immediately adjacent the wafer surface. The methods further include forming a semiconductor device feature in the denuded zone such as by implanting the wafer with dopants.

33 Claims, 10 Drawing Sheets

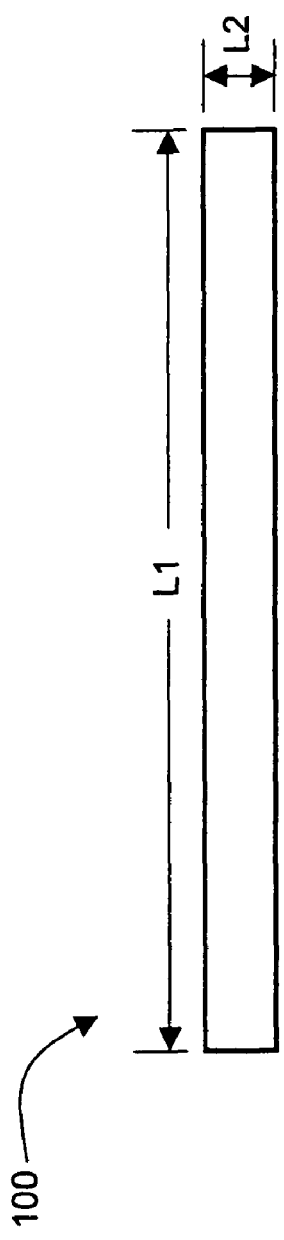
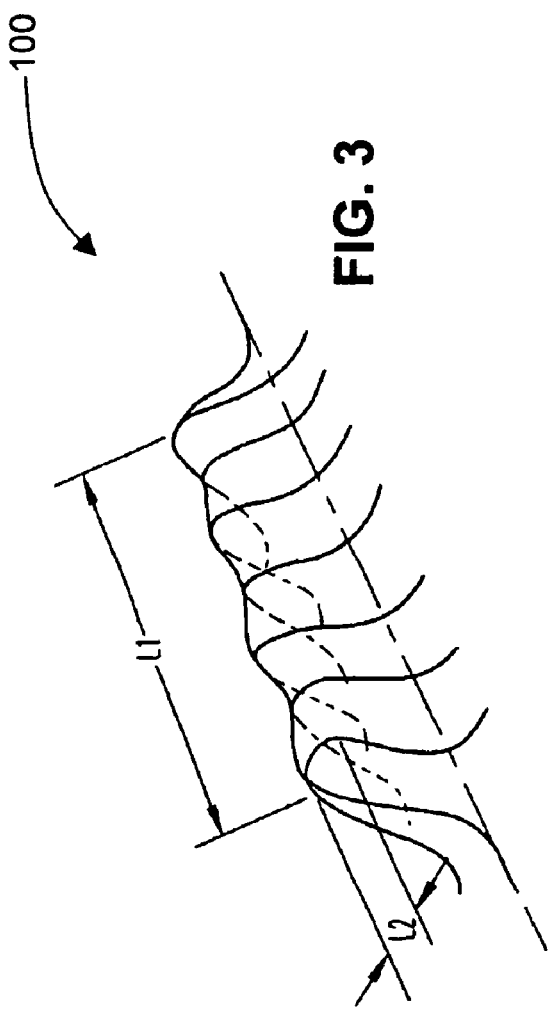

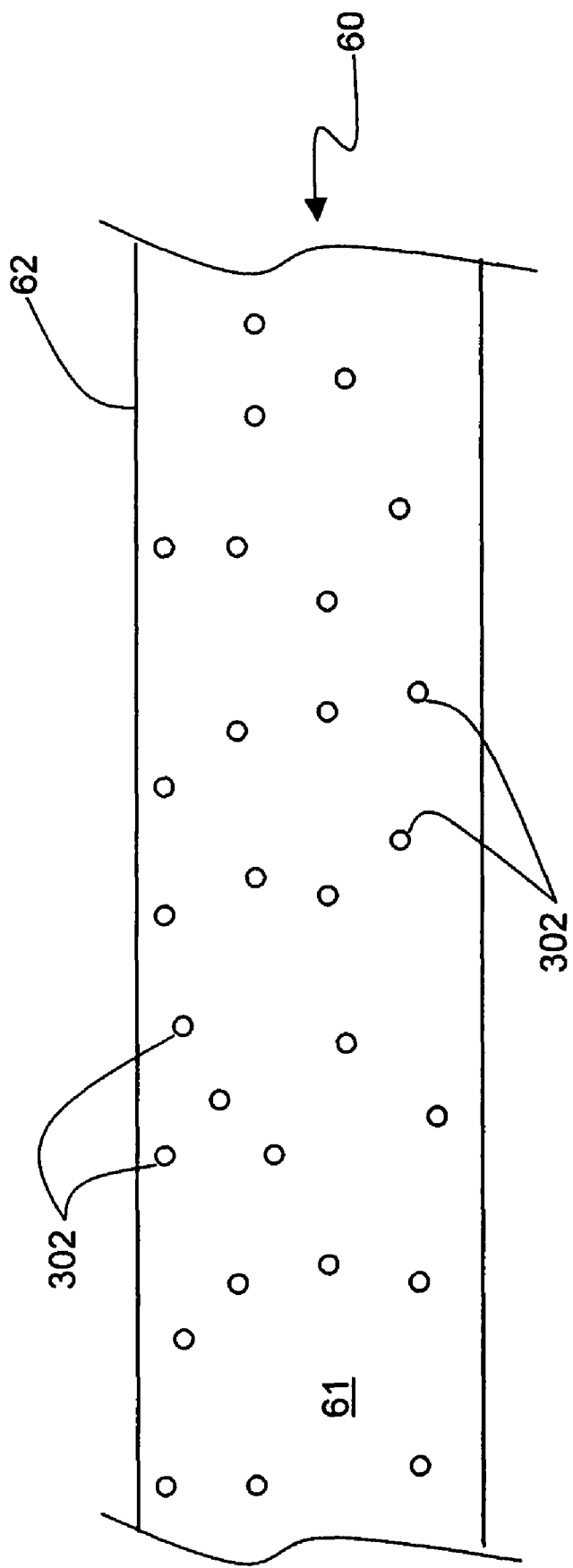

METHODS OF FORMING A DENUDED ZONE IN A SEMICONDUCTOR WAFER USING RAPID LASER ANNEALING

BACKGROUND OF THE INVENTION

1. Field of the Invention

The present invention relates generally to wafer processing, and in particular to methods of processing an oxygen-containing wafer using rapid laser annealing (RLA) to form a denuded zone at the wafer surface.

2. Description of the Prior Art

Single crystal silicon wafers for semiconductor manufacture are usually cut from large single crystals grown from liquid silicon using a process called the "Czochralski" process. In this process, molten silicon is contained in a vessel made from silicon oxide ($SiO_2$) so that the resulting silicon crystal contains about $10^{18}$ atoms of oxygen per cubic centimeter. Depending on the thermal history of the silicon wafer, the oxygen atoms occupy substitutional sites in the crystal lattice.

During crystal growth, vacancies and interstitials are both present in the ingot. Which of these defects dominate depends on the ratio of crystal growth (v) to the axial thermal gradient at the interface (G). A high v/G ratio results in a vacancy-dominant crystal, while a low v/G ratio results in an interstitial-dominant crystal. Once the crystal cools down, the point defects agglomerate into larger defects. The interstitials form 1 to 2 mm dislocation loops (known as "A type" dislocations). The vacancies form 50-200 nm voids known as COPs D-defects (or just "COP defects" for short), where COP stands for "crystal-oriented particle".

The most economical way to grow a silicon crystal is as fast as possible. However, fast crystal grown results in a vacancy-dominant structure that leads to COP defects in the crystal. The COP defects present on the surface of the wafer can be problematic. In particular, a COP defect can adversely affect the gate dielectric quality, even to the point in extreme cases where the gate is totally shorted. One of the benefits of high-temperature annealing is that it reduces the amount of COP defects at the same time it generates oxygen precipitates that act as gettering centers for process impurities that otherwise will interfere with the device operation.

The electrical circuitry eventually formed in and on the wafer during the semiconductor manufacturing process occupies only a very thin section of the wafer body immediately adjacent the wafer surface. Accordingly, one approach to avoiding the hazards presented by the aforementioned oxygen-related surface defects is to grow an epitaxial layer of pure silicon on the wafer surface. This can be done using, for example, chemical vapor deposition (CVD). The epitaxial layer is usually lightly doped as compared to the underlying single-crystal wafer. The underlying single crystal wafer serves as a template that orients the atoms so that the epitaxial layer is atomically aligned to the underlying single crystal. The vapor-phase grown epitaxial layer is relatively free of oxygen atoms so that the above-described problems with oxygen-related surface defects is avoided. Unfortunately, growing an epitaxial layer on a silicon wafer is an expensive proposition, adding about a 20-50% premium to the cost of an ordinary silicon wafer.

Another approach to reducing oxygen-related surface defects that is less expensive than growing an epitaxial layer is to reduce the concentration of oxygen atoms near the wafer surface by heating the wafer in an inert atmosphere. This allows the oxygen near the wafer surface to out-diffuse and form an oxygen-depleted surface region called a "denuded zone". Wafers processed in this manner are commercially available from a variety of wafer manufacturers. The typical approach is to use a furnace to heat the entire wafer to a temperature between 600° C. and 700° C. for one to two hours, and then to rapidly cool the wafer. However, this is a time-consuming process and the rapid cooling is hard to carry out in this furnace-based approach.

Yet another approach to forming a denuded zone in an oxygen-containing wafer involves flash annealing. Flash annealing uses millisecond-long, high-intensity flashes from a flash lamp to irradiate the entire top wafer surface at once. However, the sudden burst of energy heats only the very top surface of the wafer and causes the entire wafer to bow severely. The resulting stresses may result in a permanently warped wafer if the stress levels exceed the elastic limit for the wafer material at the maximum temperature. Unfortunately, the available time durations of the pulse and the peak temperatures that are accessible with flash annealing cannot be used to create an optimal denuded zone.

What is needed is a fast and efficient approach to form a denuded zone at the surface of an oxygen-containing semiconductor wafer that overcomes the above limitations.

SUMMARY OF THE INVENTION

One aspect of the invention is a method of forming a denuded zone in an oxygen-containing semiconductor wafer. The method includes forming a radiation beam of a wavelength that is capable of being absorbed by the wafer. The method further includes scanning the radiation beam across the wafer surface to briefly raise the temperature of each scanned point on the wafer surface to be at or near the wafer melting temperature to cause oxygen near the surface to diffuse through the wafer surface.

Another aspect of the invention is a method of processing a semiconductor wafer. The method includes providing an oxygen-containing semiconductor wafer unsuitable for direct use for manufacturing a semiconductor device. The method further includes performing the method described immediately above to form a denuded zone at the surface of the wafer. The method further includes further processing the wafer to form a semiconductor device structure, such as by implanting dopants into the surface of the wafer.

Another aspect of the invention is a method of forming a denuded zone in an oxygen-containing semiconductor wafer having a body and an unpatterned or substantially unpatterned surface. The method includes scanning a radiation beam over the surface to raise the temperature of each point on the wafer surface to a maximum temperature of at least 1,200° C. for no more than 10 milliseconds to cause oxygen to diffuse out from the wafer surface to form immediately adjacent the wafer surface a shallow, oxygen-depleted region having an oxygen concentration insufficient to form oxygen-related precipitates.

Another aspect of the invention is a method of processing a semiconductor wafer. The method includes providing an oxygen-containing semiconductor wafer unsuitable for direct use for manufacturing a semiconductor device. The method further includes performing the method described immediately above to form a denuded zone at the surface of the wafer. The method also includes further processing the wafer to form a semiconductor device structure, such as by implanting dopants into the surface of the wafer.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention that are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the description serve to explain the principles and operations of the invention.

BRIEF DESCRIPTION OF THE DRAWINGS

FIG. 2 is a schematic diagram of an idealized version of the image formed by the RLA apparatus of FIG. 1;

FIG. 3 is a schematic diagram of an example actual image intensity distribution of the image formed by the apparatus of FIG. 1;

FIG. 5A is a close-up cross-sectional schematic diagram of the oxygen-containing wafer prior to processing, showing oxygen atoms in the wafer body, including those immediately adjacent the wafer surface;

DETAILED DESCRIPTION OF THE PREFERRED EMBODIMENTS

Figure 1:
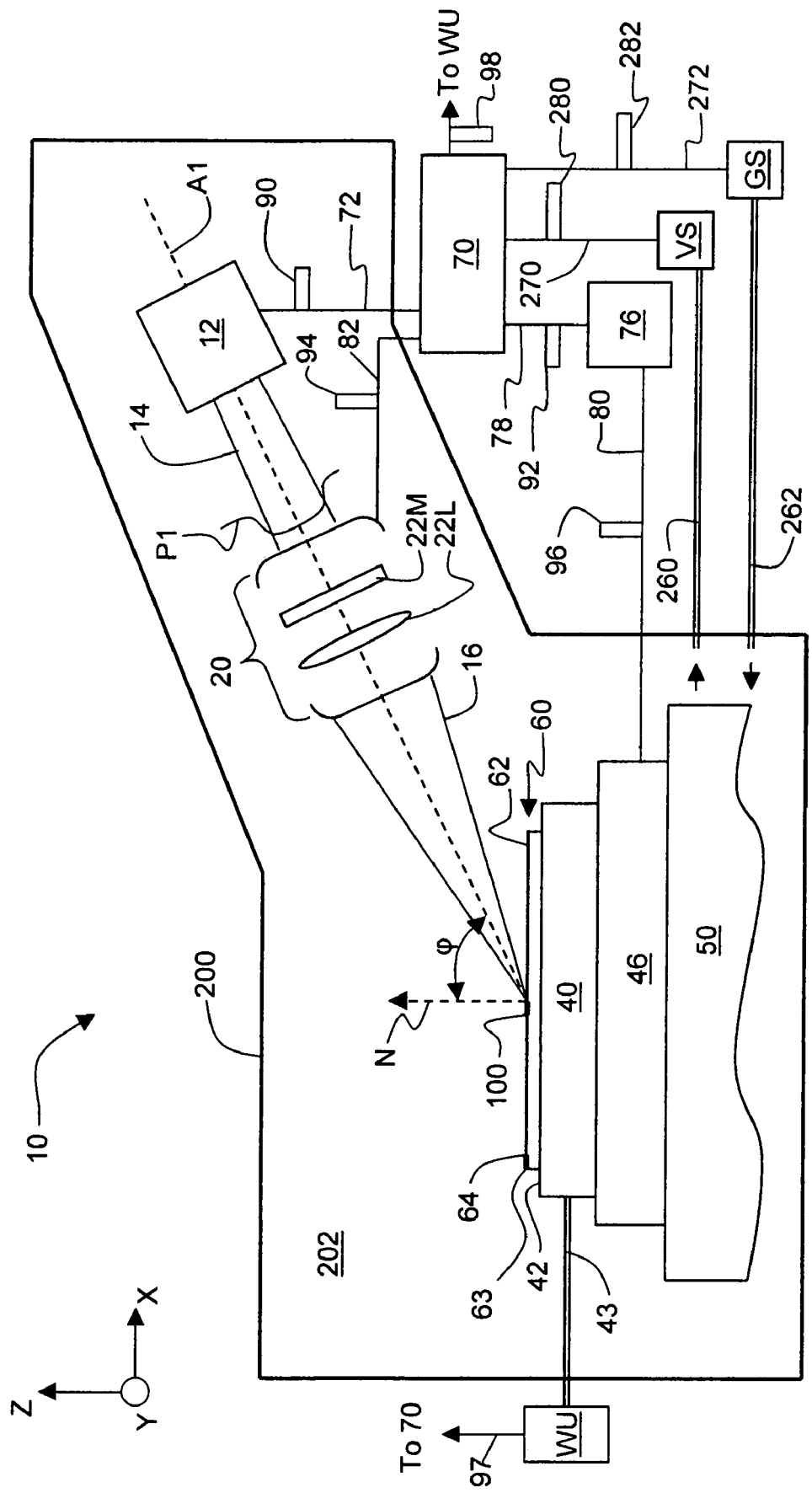
FIG. 1 is a schematic diagram of an example embodiment of a rapid laser annealing (RLA) apparatus suitable for carrying out the methods of the present invention.

The present invention relates generally to wafer processing, and in particular to methods of processing a wafer, e.g., an oxygen-containing wafer, using rapid laser annealing (RLA) to form a denuded zone at the wafer surface. The invention may be applied to wafers comprising various semiconductor materials. The materials may be single crystalline, polycrystalline, or amorphous. In addition, both elemental and compound semiconductors may be processed using the invention. In some instances, the semiconductor material may be strained, e.g., under tension or compression. Furthermore, the invention may be used in conjunction with direct and indirect bandgap semiconductors. Exemplary indirect bandgap semiconductors include Si, Ge, and SiC. Direct bandgap semiconductors include, for example, GaAs, GaN, and InP.

The present invention is ideally applied to a completely unpatterned (bare) wafer surface, though it can also be used for wafers that have some degree of patterning to the extent such patterning does not substantially affect the uniformity of the laser energy absorption by the wafer surface. The invention is also ideally applied to oxygen-containing single-crystalline silicon wafers.

In the description below, and as is understood in the art of semiconductor manufacturing, a "denuded zone" is an impurity-depleted region of a semiconductor wafer having an impurity concentration insufficient for impurity-related precipitates to form. For example, essentially all silicon wafers grown using the Czochralski method have an oxygen concentration that is sufficient to form precipitates to start with. An oxygen concentration typical of a denuded zone might lie in the range from $\sim 1 \times 10^{17}$ to $\sim 5 \times 10^{18}$ atoms/cm$^3$. The term "impurity containing" is used herein in contrast to the term "denuded zone" to describe a wafer or regions of a wafer having an impurity concentration (e.g., oxygen concentration) sufficient to form impurity-related (e.g., oxygen-related) precipitates. In an example embodiment, the denuded zone formed using the methods of the present invention has an oxygen concentration at the wafer surface of 3 parts-per-million-atoms (ppma) or less, which may represent an oxygen or oxygen precipitate concentration reduction of at least about one order of magnitude from the wafer bulk.

It should be noted that wafers that are suitable for use in semiconductor manufacturing have already undergone some type of rehabilitative processing to form either a denuded zone (e.g., through conventional crystal growing techniques and additional thermal processing) or through the extra step of growing an epitaxial layer, as discussed above. Accordingly, the present invention has particular utility in connection with newly fabricated wafers that require rehabilitative processing of the type described above to make the wafers suitable for direct use in fabricating semiconductor devices (e.g., integrated circuit chips).

In the description below, "surface heating" of the wafer and like concepts are understood as heating the wafer surface as well as a very small portion of the wafer body immediately adjacent to the wafer surface down to a relatively shallow depth as compared to the overall thickness of the wafer. In example embodiments of the present invention, this shallow depth is typically on the order of microns (e.g., 50-100 microns), or much deeper than the deepest semiconductor structure to be formed in the wafer.

The present invention is related U.S. Pat. Nos. 7,157,660, 6,747,245, 6,531,681, 6,366,308, 6,300,208, 5,956,603 and to U.S. Patent Application Publication No. 2005/0045604, which patents and patent publication are incorporated by reference herein in their entirety and which are commonly owned by the present Assignee.

Laser Annealing Apparatus

FIG. 1 is a schematic diagram of an example embodiment of a laser-based wafer annealing apparatus 10 suitable for performing rapid laser annealing (RLA) and is thus suitable for use in carrying out the methods of the present invention as described below. A similar apparatus is described in aforementioned U.S. Pat. No. 6,747,245. Cartesian coordinates are provided in FIG. 1 for the sake of reference.

RLA apparatus 10 of FIG. 1 includes, along an optical axis A1, a laser radiation source 12 that emits a continuous laser radiation beam 14 having output power and an intensity profile P1 as measured at right angles to the optical axis. In an example embodiment, radiation beam 14 is collimated. Also in an example embodiment, laser radiation source 12 includes a continuous-wave laser such as a carbon dioxide ($CO_2$) laser operating at a wavelength between about 9.4 microns and about 10.8 microns. A $CO_2$ laser is a very efficient converter of electricity into radiation and its output beam is typically very coherent so that profile P1 is Gaussian. Further, the infrared wavelengths generated by a $CO_2$ laser are suitable for processing (e.g., heating) silicon (e.g., a silicon wafer such as semiconductor wafer), as discussed below. In another example embodiment, laser radiation source 12 includes at least one laser diode, such as described in aforementioned U.S. Patent Application Publication No. 2005/0045604. Generally, radiation beam 14 includes radiation of a wavelength (e.g., 10.6 microns or other infrared wavelengths) that is capable of being absorbed by a semiconductor wafer (particularly a silicon wafer) and that is therefore capable of heating the wafer.

In an example embodiment, apparatus 10 also includes an optical system 20 operably arranged downstream from radiation source 12. Optical system 20 is adapted to receive radiation beam 14 and modify (e.g., focus, shape, redirect, etc.) it to form a modified radiation beam 16. Optical system 20 can be constituted by one or more optical elements 22, such as at least one lens element 22L and/or at least one mirror element 22M. In an example embodiment, optical system 20 may also include movable optical elements 22 such as one or more scanning mirrors 22M and/or one or more movable lenses 22L to effectuate scanning of radiation beam 16 over the wafer surface, as discussed in greater detail below.

Apparatus 10 further includes, downstream from optical system 20, a chuck 40 with an upper surface 42. Chuck 40 is supported by stage 46 that in turn is supported by a platen 50. In an example embodiment, chuck 40 is incorporated into stage 46. In an example embodiment, stage 46 is movable. Further in an example embodiment, wafer stage 46 is rotatable about one or more of the X, Y and Z axes and is also movable in each of these directions. Chuck upper surface 42 is adapted to securely support a wafer 60. Wafer 60 includes a body 61 (not shown in FIG. 1; see FIG. 5A), a surface 62 with a surface normal N, and an edge 63. In example embodiments, wafer 60 is secured to chuck upper surface 42 via electrostatic force or via vacuum. In an example embodiment, chuck 40 is operably connected to a water cooling unit WU via a water line 43 and chuck 40 is adapted to be water cooled to maintain the wafer body 61 at a select background (base) temperature.

Wafer 60 may include a reference feature 64, such as a notch or flat, to facilitate alignment of the wafer in apparatus 10, as described below. In an example embodiment, reference feature 64 also serves to identify the crystal orientation of a monocrystalline wafer 60. In an example embodiment, wafer 60 is an unpatterned or substantially unpatterned monocrystalline silicon wafer, such as described in document #Semi M1-600, "Specifications for Polished Monocrystalline Silicon Wafers," available from SEMI (Semiconductor Equipment and Materials International), 3081 Zanker Road, San Jose 95134, which document is incorporated by reference herein. Such wafers contain oxygen and need to include either a denuded zone or an epitaxial layer in order to be suitable for forming semiconductor devices using standard semiconductor manufacturing processes.

In an example embodiment, optical axis A1 and wafer normal N form an angle $\phi$, which is the (central) incident angle that radiation beam 16 makes with wafer surface 62. In an example embodiment, incident angle $\phi > 0$ to ensure that radiation specularly reflected from wafer surface 62 does not return to radiation source 12. Generally, the incident angle $\phi$ can vary over the range $0° < \phi ° 90°$. In an example embodiment, radiation beam 16 is P-polarized with respect to the substrate and incident angle $\phi$ corresponds to the Brewster angle $\phi_B$ associated with the wafer composition and the wavelength of the laser beam.

In an example embodiment, apparatus 10 further includes a controller 70 coupled to radiation source 12 via a communication line ("line") 72 and coupled to a stage controller 76 via a line 78. Stage controller 76 is operably coupled to stage 46 via a line 80 to control the movement of the stage. In an example embodiment, controller 70 is also coupled to optical system 20 via a line 82. Controller 70 controls the operation of radiation source 12, stage controller 76, and optical system 20 (e.g., the movement of elements therein) via respective signals 90, 92 and 94. Stage controller 76 also controls the movement of stage 40 via a signal 96. Controller 70 is also operably coupled to water cooling unit WU via a control line 97 and is controlled thereby via a control signal 98.

In one example embodiment, one or more of lines 72, 78, 80, 82 and 97 are wires and corresponding one or more of signals 90, 92, 96, 94 and 98 are electrical signals, while in another example embodiment one or more of the aforementioned lines are an optical fiber and corresponding one or more of the aforementioned signals are optical signals.

In an example embodiment, controller 70 is a computer, such as a personal computer or workstation, available from any one of a number of well-known computer companies such as Dell Computer, Inc., of Austin Tex. Controller 70 preferably includes any of a number of commercially available micro-processors, such as an Intel PENTIUM series, or AMD K6 or K7 processors, a suitable bus architecture to connect the processor to a memory device, such as a hard disk drive, and suitable input and output devices (e.g., a keyboard and a display, respectively).

In an example embodiment, apparatus 10 further includes a chamber 200 having a sealed interior 202 that contains a select wafer processing environment, such as vacuum, an inert gas (e.g., He), non-inert gas (e.g., $H_2$, $O_2$), or combinations thereof. In an example embodiment chamber interior 202 contains laser radiation source 12 and optical system 20 so that radiation beam 16 can be directed directly to wafer surface 62 without having to pass through a chamber window.

In an example embodiment, apparatus 10 further includes a vacuum system VS and a gas supply system GS pneumatically connected to chamber interior 202 via corresponding pneumatic lines 260 and 262. Vacuum system VS and gas supply system GS are also operatively coupled to controller 70 via control lines 270 and 272 and are controlled thereby via respective control signals 280 and 282. Gas supply system GS is adapted to supply any number of suitable gases for use in creating a favorable environment for carrying out the methods of the present invention. As discussed above, example gases include helium (He), hydrogen ($H_2$) and oxygen ($O_2$).

With continuing reference to FIG. 1, radiation beam 16 is directed by optical system 20 to wafer surface 62 along axis A1. In an example embodiment, optical system 20 focuses radiation beam 16 to form an image 100 on wafer surface 62. The term "image" is used herein to generally denote the distribution of light formed on wafer surface 62 by radiation beam 16 and in the present invention is used interchangeably with the term "radiation beam" 16. Thus, image 100 does not necessarily have an associated object in the classical sense. Further, image 100 is not necessarily formed by bringing light rays to a point focus. For example, image 100 can be an elliptical spot formed by an anamorphic-type optical system 20, as well as a circular spot formed by a normally incident, focused beam from a circularly symmetric optical system. Also, the term "image" includes the light distribution formed on wafer surface 62 by intercepting radiation beam 16 with wafer surface 62.

Image 100 may have any number of shapes, such as square, rectangular, oval, line, etc. Image 100 can also have a variety of different intensity distributions, including ones that correspond as close as possible to a uniform line image distribution. FIG. 2 illustrates an example embodiment of image 100 in the form of an idealized line image. An idealized line image 100 has a long dimension (length) L1, a short dimension (width) L2, and uniform (i.e., flat-top) intensity.

In practice, line image 100 is not entirely uniform because of diffraction effects and/or other effects (e.g., aberrations in optical system 20). FIG. 3 is a two-dimensional plot representative of the intensity distribution associated with an actual example line image 100. For most applications, the integrated cross-section in the short dimension L2 need only be substantially uniform from point-to-point along the long dimension L1, since this assures uniform heating. In an example embodiment, an integrated intensity distribution uniformity of about ±0.2% over the operationally useful part of image 100 is sufficient for processing wafer 60 according to the RLA method of the present invention as described below.

Figure 4:
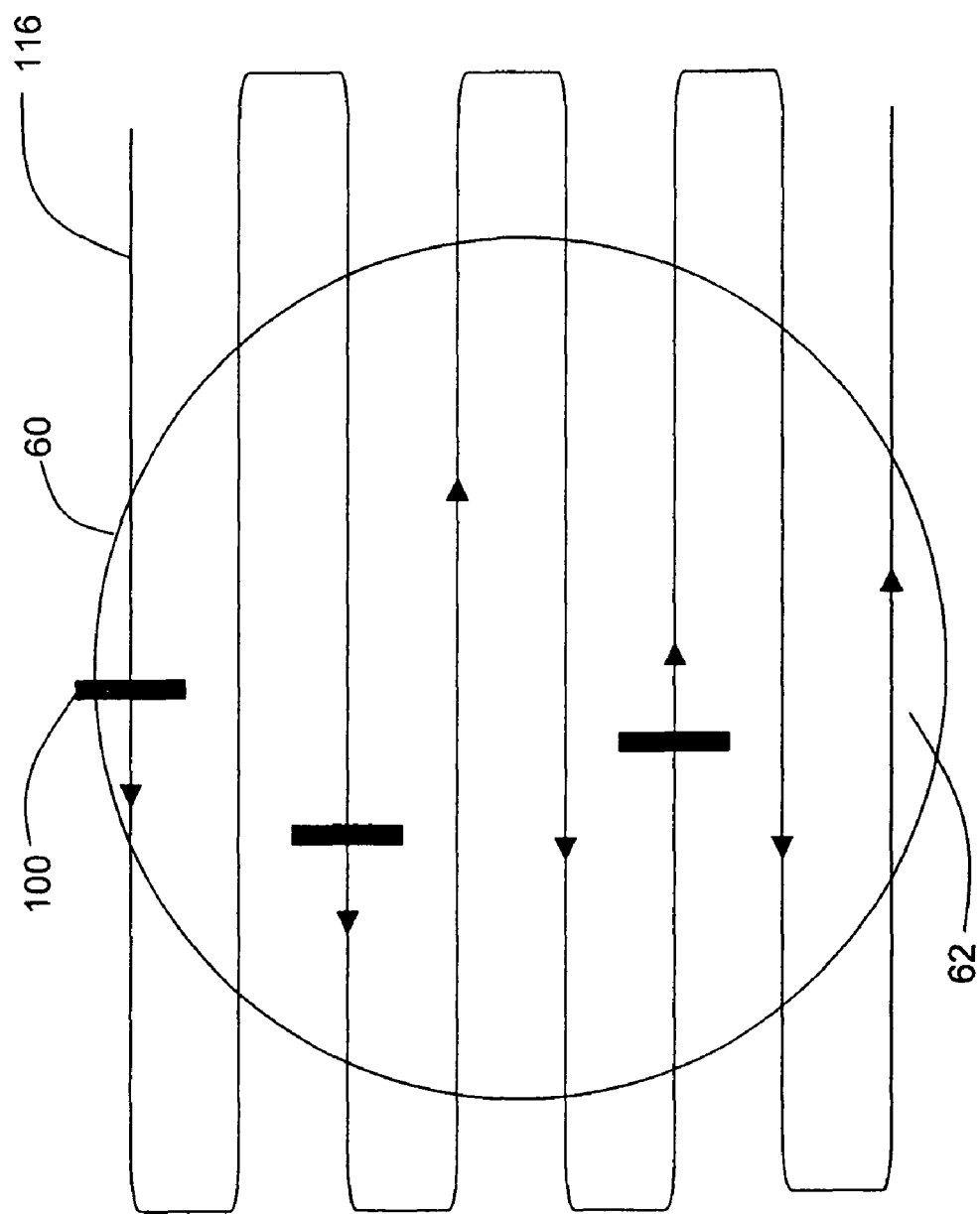
FIG. 4 is a plan view of the wafer that illustrates an example raster-type scanning path taken by the radiation beam image when irradiating the wafer surface to carry out an example method of the present invention.

FIG. 4 is a plan view of wafer 60 that illustrates an example raster-type scanning path 116 taken by image 100 (i.e., radiation beam 16) when irradiating wafer surface 62. Other scanning paths 116 can also be used. It should be noted that a scanning path 116 that overlaps itself (i.e., where at least one point or region on the wafer surface is scanned twice) generally does not create a problem in forming denuded zone 65 as described below, especially when the overlap occurs more than a few seconds later. This is because once the oxygen is depleted from the denuded zone and the region cools off (on the order of 1-2 seconds), re-heating does not result in significant diffusion of oxygen from the bulk region into the denuded zone or out of the denuded zone into the atmosphere.

Method of Forming Denuded Zone

As discussed above, a newly minted silicon wafer typically contains oxygen and is thus prone to the formation of oxygen-related surface defects (e.g., precipitates) that can adversely affect the performance of semiconductor devices formed on the wafer. The present invention is a method of forming a denuded zone immediately adjacent the wafer surface of an oxygen-containing semiconductor wafer using RLA. The method may be used either alone or in combination with other methods such as those described above. The result of the method is a wafer with a denuded zone, which makes the oxygen-containing wafer suitable for use in semiconductor manufacturing without the need for further rehabilitative processing, such as forming an epitaxial layer.

The method of the present invention is now described with reference to RLA apparatus 10 of FIG. 1. An oxygen-containing wafer 60 is arranged in RLA apparatus 10 on chuck 40 and is secured to upper surface 42 thereof so that surface 62 faces upward (Z-direction). Radiation beam 16 (or equivalently, image 100 formed by radiation beam 16) is scanned over wafer surface 62 to quickly raise the wafer surface temperature of each point thereon that is scanned to either a temperature close to the melting point of the wafer (e.g., to 1200° C. for silicon) or to a temperature corresponding to the actual melting point of the wafer (e.g., 1420° C. for silicon). As discussed below, the wafer surface may temporarily exhibit a temperature slightly higher than, at, or slightly below the melting point of the wafer, depending on the desired effects to be achieved. Since radiation beam 16 is scanned quickly over wafer surface 62 (the dwell time of image 100 is preferably on the order of milliseconds or less, and in an example embodiment is preferably no more than 10 milliseconds), the bulk of the wafer remains at the base temperature and subsequent cooling of each point on wafer surface 62 occurs essentially as fast as the heating.

Figure 5B:
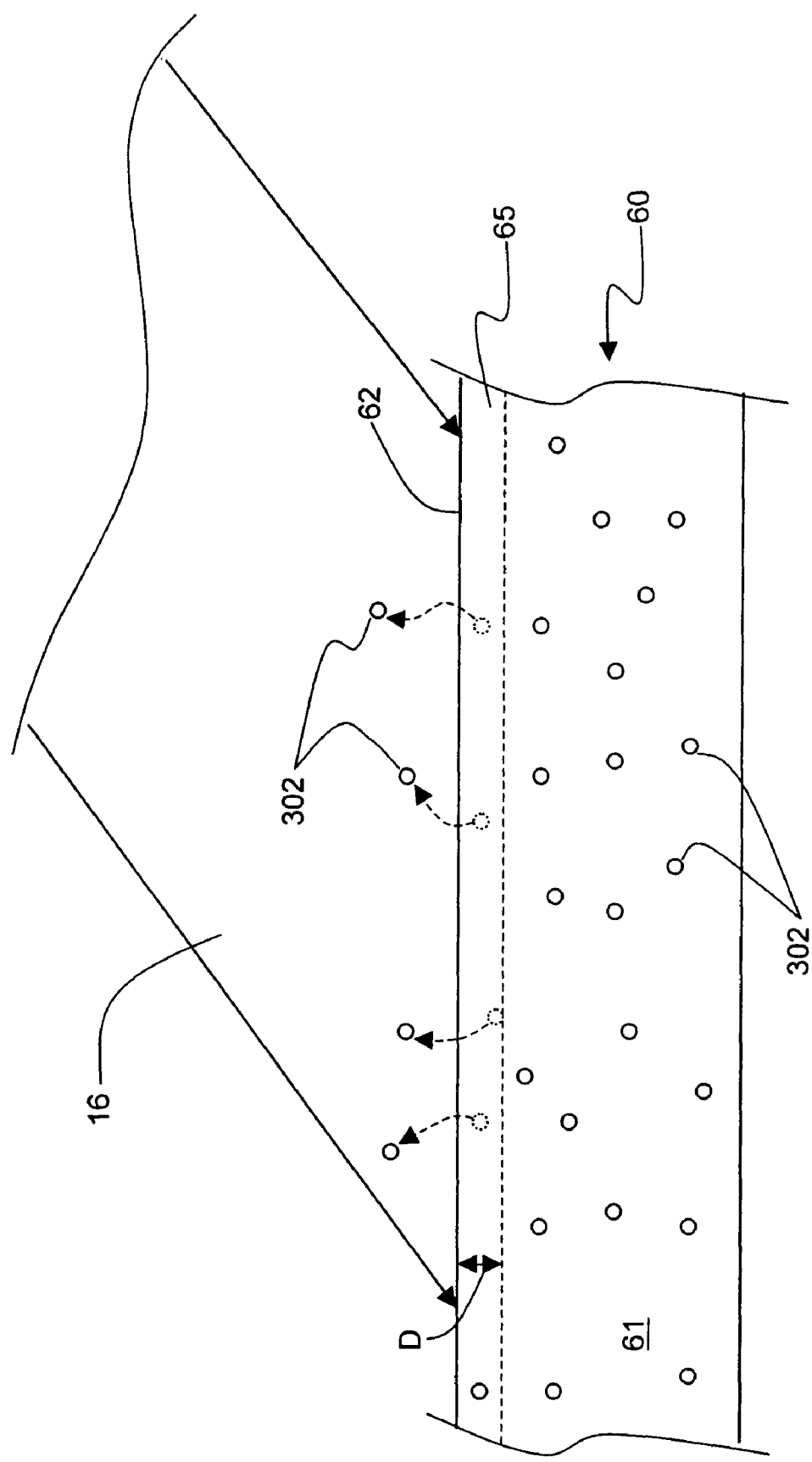
FIG. 5B is similar to FIG. 5A, with the wafer being subjected to a scanned radiation beam from the RLA apparatus of FIG. 1, illustrating how the oxygen near the wafer surface diffuses out from the wafer surface to form a denuded zone of depth D.

FIG. 5A is a close-up cross-sectional schematic diagram of the wafer prior to being subjected to RLA, showing oxygen atoms 302 in the wafer body, including those immediately adjacent wafer surface 62. FIG. 5B is a close-up view of wafer 60 as it undergoes RLA by being scanned with radiation beam 16. The rapid heating of each point on wafer surface 62 causes oxygen 302 near the wafer surface to diffuse out from the wafer surface, thereby forming a denuded zone 65 that extends to a depth D below wafer surface 62. Ideally, the depth D of denuded zone 65 exceeds the depth of the deepest circuit feature (e.g., a junction and its associated depleted region) that would be formed in the wafer when fabricating a semiconductor device.

It is important to note that the very high thermal gradient formed in wafer surface 62 and the rapid heating and cooling associated with the RLA process leaves the concentration of oxygen 302 residing farther away from wafer surface 62 (i.e., in the remainder of wafer body 61) unaffected. This oxygen thus does not diffuse toward the top surface and back-fill the denuded zone with oxygen, which would defeat the entire process.

Given the very short duration of the heating cycle, and the fact that the bulk of the wafer is not heated appreciably, it is possible to employ higher temperatures and achieve higher oxygen diffusion rates at the wafer surface than prior art methods. Also, since the high temperature is localized to the region immediately surrounding the laser image, it is possible to achieve higher temperatures without permanently distorting the wafer. The high thermal gradient produced by radiation beam 16 produces a high, localized stress, which under steady state conditions would result in movement of the dislocations in the silicon lattice and a permanent warping of the flat wafer surface. However, semiconductor wafers (particularly silicon wafers) are visco-elastic and for all practical purposes, in the short (e.g., millisecond) time-frame of a RLA heating pulse, the dislocations are immobile. Consequently, the wafer surface is not permanently warped by the high stress levels induced by radiation beam 16.

In an example embodiment, scanning of radiation beam 16 is accomplished by moving stage 46 via the operation of controller 70 and control signals 92 and 96. In another example embodiment, scanning of radiation beam 16 is accomplished through optical system 20, e.g., by moving one or more adjustable mirrors 22M therein that serve as scanning mirrors, via the operation of controller 70 and control signal 94 (and optionally control signal 90 to turn laser radiation source 12 on and off or otherwise control its output intensity).

In an example embodiment, the environment in chamber interior 202 that surrounds wafer surface 62 includes an inert gas. In a specific example embodiment, the inert gas is helium (He). Further to this example embodiment, the environment contains a very low concentration of oxygen to reduce the formation of surface pits.

Figure 6:
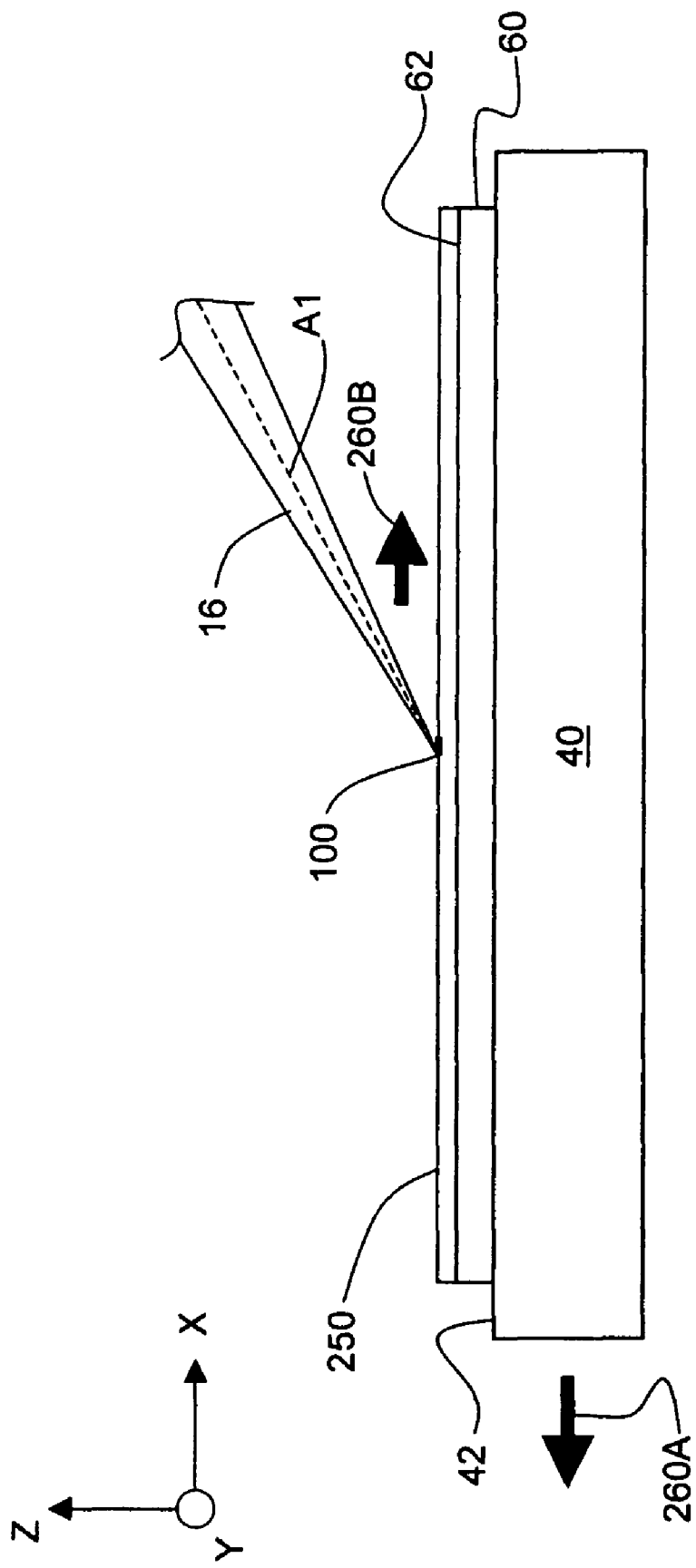
FIG. 6 is a close-up schematic diagram of the chuck and wafer of the RLA apparatus of FIG. 1, wherein the wafer is coated with an absorptive layer for the case when the radiation beam is used to melt the wafer surface.

With reference now to FIG. 6, in an example embodiment where wafer surface 62 is melted, an absorptive coating 250 is provided to the wafer surface, wherein the absorptive material has a higher melting point than the wafer, which for a silicon wafer is 1420° C. Absorptive layer 250 has absorptive characteristics and a thickness so that 50% or more of the incident radiation from radiation beam 16 is absorbed by the absorptive layer prior to reaching the underlying wafer surface 62.

Preferably, absorptive coating 250 is easily removed from the wafer surface without damaging the wafer surface (e.g., using standard semiconductor processing techniques) once the wafer has been processed as described above. Example coatings include metal oxides, metal nitrides, metal carbides and more specifically amorphous carbon, silicon dioxide, silicon nitride, tantalum nitride, tungsten, and tantalum. The use of these coatings in the context of rapid thermal annealing is discussed in detail in aforementioned U.S. Pat. Nos. 5,956,603 and 6,300,208. In FIG. 6, scan arrows 260A and 260B respectively illustrate moving stage 46 in the −X direction or moving radiation beam 16 in the +X direction to effectuate scanning. In an example embodiment, both the stage and the beam are moved to effectuate scanning.

Figure 7:
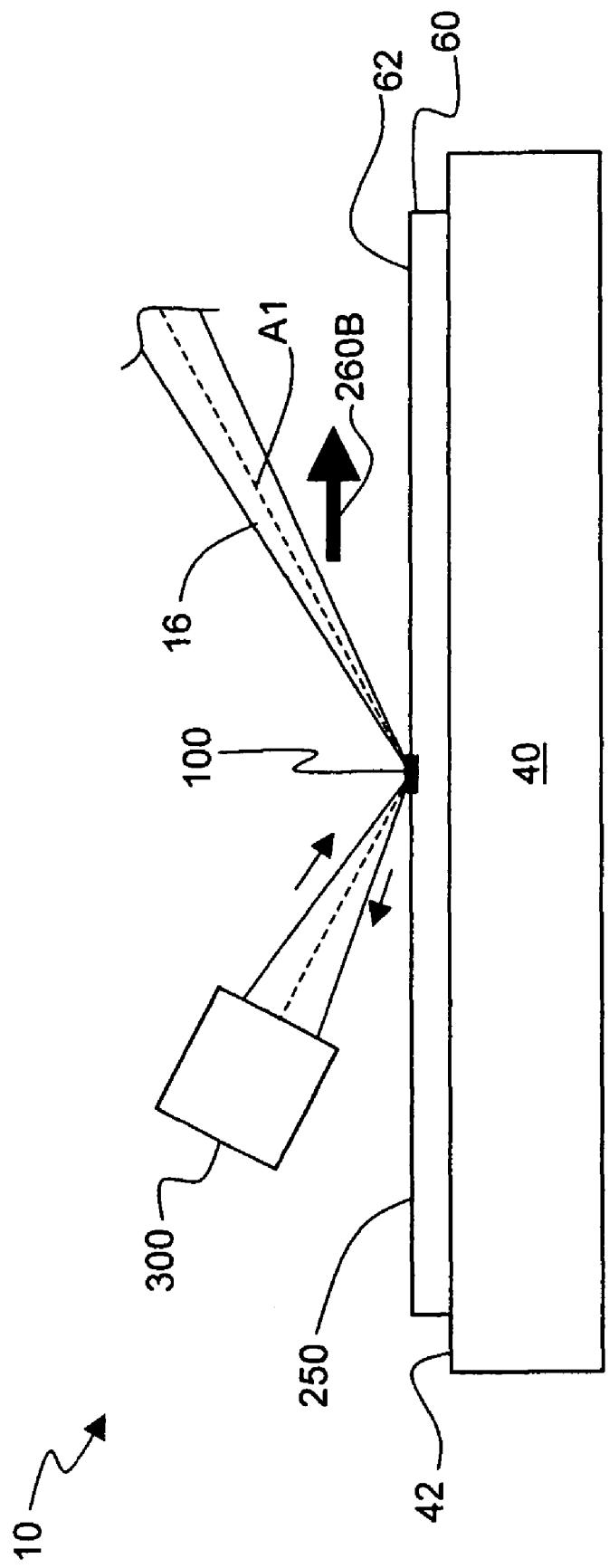
FIG. 7 is a close-up schematic diagram similar to that of FIG. 6 (without the absorptive layer), illustrating an example embodiment wherein the RLA apparatus of FIG. 1 includes a recycling optical system that contributes to the image intensity of the image scanned over the wafer surface.

FIG. 7 is a close-up schematic diagram of a portion of RLA apparatus 10 illustrating an example embodiment that includes a recycling optical system 300, such as described in U.S. Pat. No. 7,154,066, U.S. patent application Ser. No. 10/838,076, U.S. Pat. No. 7,098,155, U.S. patent application Ser. No. 11/481,458, U.S. patent application Ser. No. 11/592,770, and U.S. patent application Ser. No. 11/257,291, which patents and patent applications are all incorporated herein by reference and are assigned to the present Assignee. Recycling optical system 300 is arranged to receive radiation from radiation beam 16 that is reflected from wafer surface 62 and return it to the wafer surface where image 100 is formed, thereby increasing the intensity of image 100 and thus the heating efficiency of radiation beam 16. In the case of wafers exhibiting a non-uniform reflectivity to the incident laser beam due to patterns or other coatings on the wafer surface, the heating uniformity is improved by optically adapting a recycling system to return radiation to the point on the surface of the wafer from where it was reflected.

Wafer Patterning and Semiconductor Device Formation

An aspect of the method of the present invention includes patterning a denuded-zone wafer 60 after it has been processed as described above. A further aspect of the invention includes forming one or more semiconductor device features in the denuded-zone 65 of wafer 60 formed using the method described above to form an operating semiconductor device.

Figure 8:
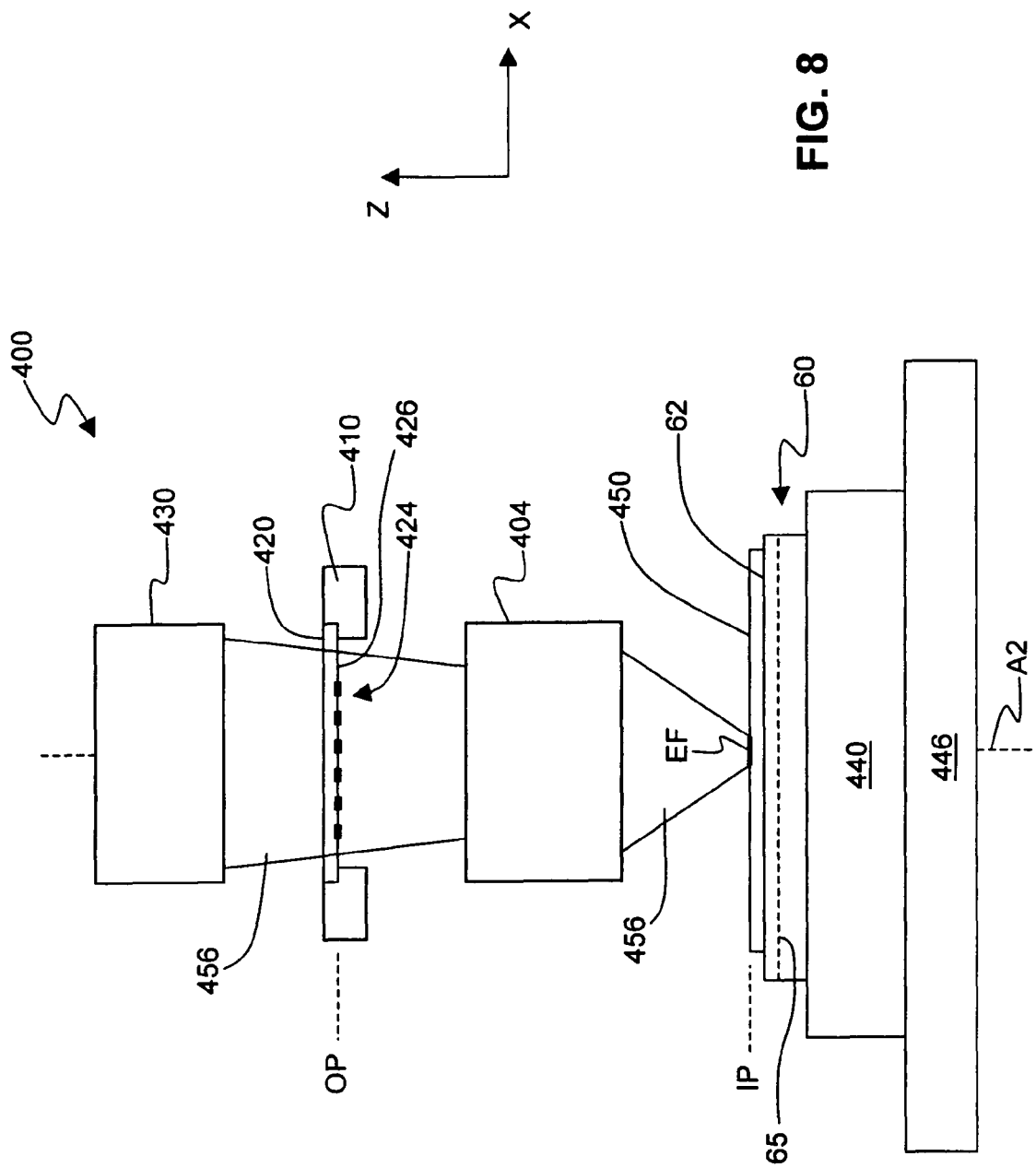
FIG. 8 is a schematic diagram of a wafer patterning system in the form of a photolithography apparatus that is used to pattern wafers processed according to the method of the present invention.

FIG. 8 is an example embodiment of a wafer patterning system 400 in the form of a photolithography apparatus. System 400 includes an optical axis A2 along which is arranged a projection lens 404 that has an object plane OP and an image plane IP. System 400 includes a mask stage 410 adapted to support a mask 420 at object plane OP. Mask 420 has a pattern 424 formed on a mask surface 426. An illuminator 430 is arranged adjacent mask stage 410 opposite projection lens 404 and is adapted to illuminate mask 420.

System 400 also includes a chuck 440 that securely supports wafer 60. Chuck 440 is supported by a wafer stage 446 adapted to movably support chuck 440 so that wafer surface 62 lies in or near image plane IP. In an example embodiment, wafer surface 62 is coated with a photosensitive layer 450 that is activated by one or more wavelengths of radiation 456 from illuminator 430. Such radiation is referred to in the art as "actinic radiation". In an example embodiment, the one or more wavelengths of radiation may include one or more of the mercury g, h and i lines, or one of the excimer laser wavelengths such as 248 nm and 193 nm, or an extreme ultra-violet (EUV) wavelength, which is of the order of 10 nm (e.g., 13 nm).

In operation, illuminator 430 illuminates mask 420 so that pattern 424 is imaged at image plane IP by projection lens 404, thereby forming a pattern in photoresist layer 450. The result is an exposure field EF that covers a portion of wafer surface 62. Wafer stage 446 then moves ("steps") wafer 60 in a given direction (e.g., the X-direction) by a given increment (e.g., the size of one exposure field EF), and the exposure process is repeated. This step-and-expose process is repeated (hence the name "step-and-repeat") until a desired number of exposure fields EF are formed on wafer 60. The exposure process may alternatively involve a scanned exposure to create exposure field EF. The result is a patterned wafer 60, or more precisely, a wafer 60 that includes a patterned photoresist layer 450.

Wafer 60 is then removed from system 400 (e.g., using a wafer handling system, not shown) and processed (e.g., developed, baked, etched, etc.) to transfer the pattern formed in photoresist layer 450 in each exposure field EF to wafer surface 62 and to the layer or layers of material immediately under the resist layer and covering the associated denuded zone 65. In some cases the resist layer may be used as a contact mask to define the location of junctions created by implanting dopant atoms into the resist coated surface. Dopant atoms implanted in the resist coating are removed when the resist layer is stripped with the dopant atoms passing through the clear areas of the resist coating are implanted into the denuded zone, where they form transistor junctions. Repeating this photolithography process with different layers of materials and different masks allows for the fabrication of three-dimensional (3D) structures including wiring (via a metallization processes) to connect the transistors formed in and on denuded zone 65 (FIG. 5B). Thus integrated circuits are created.

Figure 9:
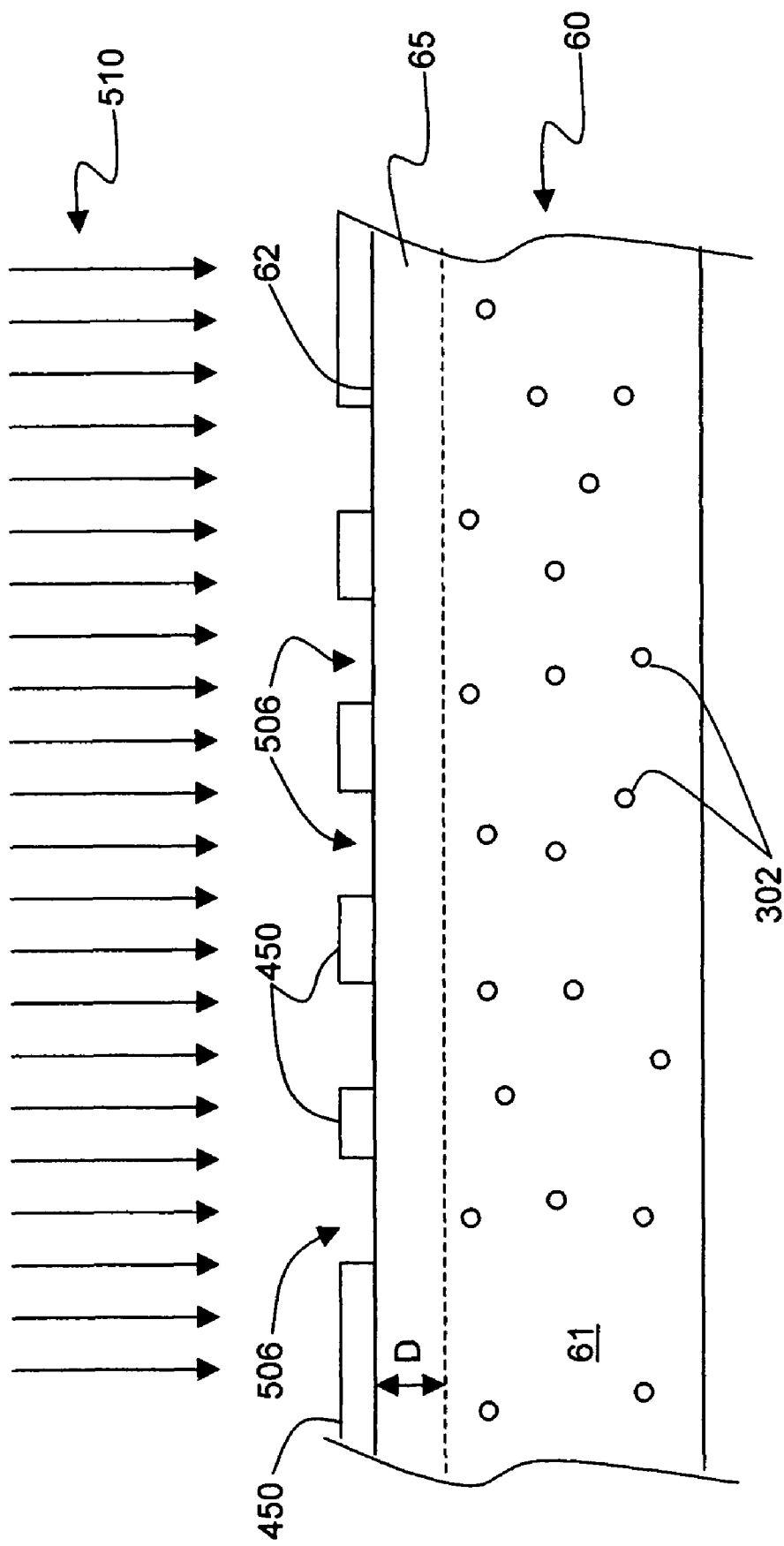
FIGS. 9 and 10 are schematic diagrams similar to FIG. 5B, illustrating an example embodiment of forming semiconductor device features in the denuded zone of the wafer subjecting a patterned photoresist coated wafer to an implant beam to form junctions.
Figure 10:
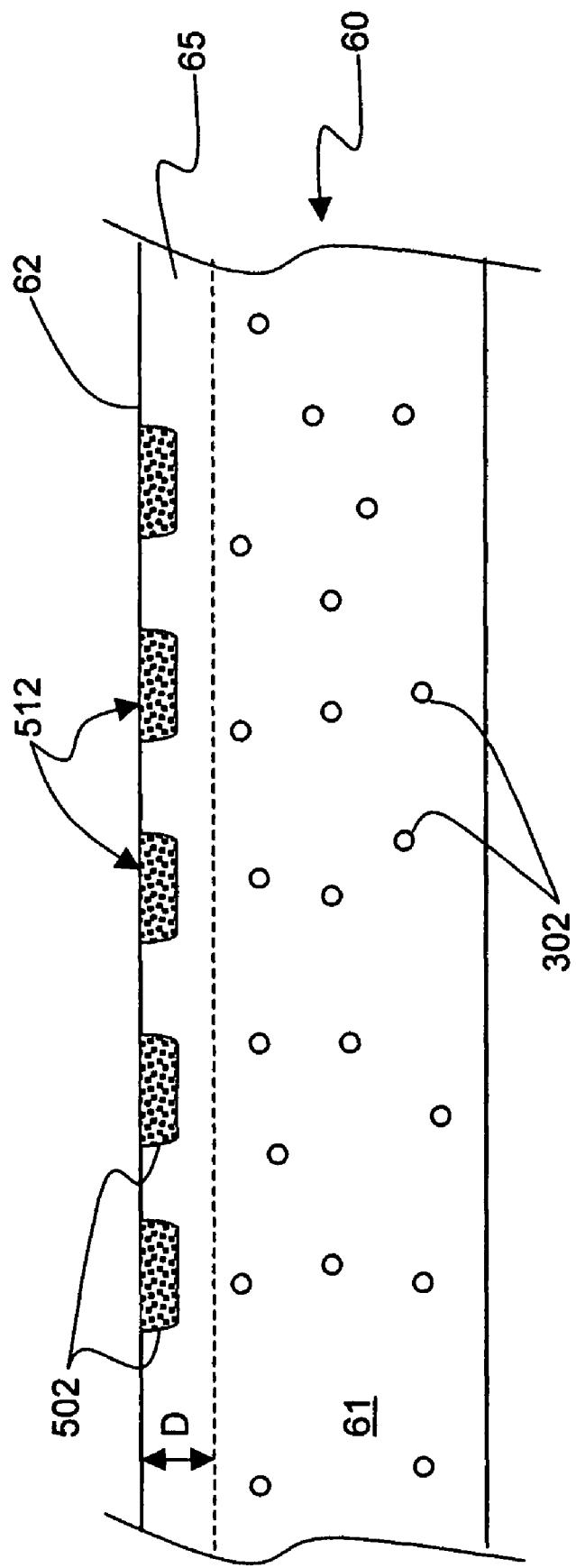

FIGS. 9 and 10 are schematic cross-sectional diagrams similar to FIG. 5B, illustrating the formation of semiconductor features in the form of junctions 502 in the denuded zone. The junctions are formed using the above-described wafer patterning process by first patterning resist layer 450 as described above to form a number of openings 506 in the photoresist layer. Wafer 60 is then subjected to exposure to an implant beam 510. Implant beam 510 is absorbed in the patterned photoresist layer 450 and by the wafer surface 62 where openings 506 reside. The patterned photoresist layer 450 is then stripped away (FIG. 10), leaving the doped junctions 502 (with dopants 512) formed within denuded layer 65.

Once the wafer is processed to the point where it contains interconnected and operational 3D structures (e.g., transistors, capacitors, etc.), the wafer is then diced and the good die are packaged and then tested to create the final semiconductor devices, such as integrated circuit (IC) chips.

In the foregoing description of the invention, various features are grouped together in various example embodiments for ease of understanding. The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Any aspects of the invention discussed herein may be included or excluded as appropriate. Accordingly, other embodiments are within the scope of the appended claims.

What is claimed is:

1. A method of forming a denuded zone in an oxygen-containing semiconductor wafer having a surface, a body, and a melting temperature, comprising:
   forming a radiation beam of a wavelength that is capable of being absorbed by the wafer; and
   scanning the radiation beam across the wafer surface to briefly raise the temperature of each scanned point on the wafer surface to be at or near the wafer melting temperature to cause oxygen near the surface to diffuse through the wafer surface by moving the wafer in a plane defined by the wafer surface wherein moving the wafer is accomplished by securing the wafer to a chuck that resides on a wafer stage, and then moving the wafer stage;
   wherein the radiation beam is formed from at least one laser that includes a laser diode.

2. The method of claim 1, wherein the wafer is formed from silicon.

3. The method of claim 1 including water-cooling the chuck to maintain the wafer at a select base temperature.

4. The method of claim 1 wherein securing the wafer to the chuck includes employing an electrostatic force or vacuum.

5. The method of claim 1, wherein the scanning is performed by moving the radiation beam while maintaining the wafer in a fixed position.

6. The method of claim 5, wherein scanning the radiation beam is performed using a scanning optical system.

7. The method of claim 6, wherein the scanning optical system includes rotating a mirror, and including effecting said scanning using said rotating mirror.

8. The method of claim 1, including containing the wafer surface in an environment that includes at least one of an inert gas and a non-inert gas.

9. The method of claim 8, wherein the environment includes helium.

10. The method of claim 1, including containing the wafer surface in a vacuum.

11. The method of claim 1, wherein the radiation beam forms an image on the wafer surface and including:
   collecting radiation from the radiation beam that is reflected from the wafer surface where said image is formed; and
   returning said collected radiation back to the image.

12. The method of claim 1, wherein the scanning is raster scanning.

13. A method of forming a denuded zone in an oxygen-containing semiconductor wafer having a surface, a body, and a melting temperature, comprising:
   forming a radiation beam of a wavelength that is capable of being absorbed by the wafer; and
   scanning the radiation beam across the wafer surface to briefly raise the temperature of each scanned point on the wafer surface to be at or near the wafer melting temperature to cause oxygen near the surface to diffuse through the wafer surface;
   wherein the radiation beam has sufficient intensity to melt the wafer surface during said scanning, and further including providing an absorptive layer atop the wafer surface that has a melting temperature greater than that of the wafer, and that has a thickness and absorption characteristics such that the absorptive layer absorbs at least 50% or more of the radiation beam incident thereon prior to passing to the underlying wafer surface.

14. A method of processing a semiconductor wafer, comprising:
   providing an oxygen-containing semiconductor wafer unsuitable for direct use for manufacturing a semiconductor device;
   forming a denuded zone in an oxygen-containing semiconductor wafer having a surface, a body, and a melting temperature, by:
      forming a radiation beam of a wavelength that is capable of being absorbed by the wafer; and
      scanning the radiation beam across the wafer surface to briefly raise the temperature of each scanned point on the wafer surface to be at or near the wafer melting temperature to cause oxygen near the surface to diffuse through the wafer surface by moving the wafer in a plane defined by the wafer surface wherein moving the wafer is accomplished by securing the wafer to a chuck that resides on a wafer stage, and then moving the wafer stage;
      wherein the radiation beam is formed from at least one laser that includes a laser diode; and
   implanting dopants into the surface of the wafer.

15. The method of claim 14, further including forming a semiconductor device in said denuded zone.

16. A method of forming a denuded zone in an oxygen-containing semiconductor wafer having a body and an unpatterned or substantially unpatterned surface, comprising:
   forming a radiation beam from at least one laser that includes a laser diode; and
   scanning a radiation beam over the surface to raise the temperature of each point on the wafer surface to a maximum temperature of at least 1,200° C. for no more than 10 milliseconds to cause oxygen to diffuse out from the wafer surface to form immediately adjacent the wafer surface a shallow oxygen-depleted region having an oxygen concentration insufficient to form oxygen-related precipitates by moving the wafer in a plane defined by the wafer surface wherein moving the wafer is accomplished by securing the wafer to a chuck that resides on a wafer stage, and then moving the wafer stage.

17. The method of claim 16, wherein the denuded zone has an oxygen concentration at the wafer surface of 3 parts-per-million-atoms (ppma) or less.

18. The method of claim 16, wherein the semiconductor wafer is a silicon wafer.

19. The method of claim 16, including water-cooling the chuck to maintain the wafer at a select base temperature.

20. The method of claim 16, wherein securing the wafer to the chuck includes employing an electrostatic force or vacuum.

21. The method of claim 16, wherein the scanning is performed by moving the radiation beam while maintaining the wafer in a fixed position.

22. The method of claim 21, wherein the radiation beam is scanned using a scanning optical system.

23. The method of claim 22, wherein the scanning optical system includes rotating a mirror, and including effecting said scanning using said rotating mirror.

24. The method of claim 16, wherein the heated wafer surface is contained in an environment that includes at least one of an inert gas and a non-inert gas.

25. The method of claim 24, wherein the environment includes helium.

26. The method of claim 16, wherein the wafer surface is contained in a vacuum.

27. The method of claim 16, wherein the radiation beam forms an image on the wafer surface, and including:

collecting radiation from the radiation beam that is reflected from the wafer surface where said image is formed; and returning said collected radiation back to the image.

28. The method of claim 16, wherein the scanning is raster scanning.

29. A method of forming a denuded zone in an oxygen-containing semiconductor wafer having a body and an unpatterned or substantially unpatterned surface, comprising:

scanning a radiation beam over the surface to raise the temperature of each point on the wafer surface to a maximum temperature of at least 1,200° C. for no more than 10 milliseconds to cause oxygen to diffuse out from the wafer surface to form immediately adjacent the wafer surface a shallow oxygen-depleted region having an oxygen concentration insufficient to form oxygen-related precipitates;

wherein the radiation beam has sufficient intensity to melt the wafer surface during said scanning, and further including providing an absorptive layer atop the wafer surface that has a melting temperature greater than the wafer, and that has a thickness and absorption characteristics such that the absorptive layer absorbs at least 50% or more of the radiation beam incident thereon prior to passing to the underlying wafer surface.

30. A method of processing a semiconductor wafer, comprising:

providing an oxygen-containing semiconductor wafer unsuitable for direct use for manufacturing a semiconductor device;

forming a denuded zone in an oxygen-containing semiconductor wafer having a body and an unpatterned or substantially unpatterned surface, by:

forming a radiation beam from at least one laser that includes a laser diode; and scanning a radiation beam over the surface to raise the temperature of each point on the wafer surface to a maximum temperature of at least 1,200° C. for no more than 10 milliseconds to cause oxygen to diffuse out from the wafer surface to form immediately adjacent the wafer surface a shallow oxygen-depleted region having an oxygen concentration insufficient to form oxygen-related precipitates by moving the wafer in a plane defined by the wafer surface wherein moving the wafer is accomplished by securing the wafer to a chuck that resides on a wafer stage, and then moving the wafer stage; and implanting dopants into the surface of the wafer.

31. The method of claim 30, further including forming a semiconductor device in said denuded zone.

32. A method of forming a denuded zone in an oxygen containing semiconductor wafer having a surface, a body, and a melting temperature, comprising:

forming a radiation beam of a wavelength that is capable of being absorbed by the wafer;

scanning the radiation beam across the wafer surface to briefly raise the temperature of each scanned point on the wafer surface to be at or near the wafer melting temperature to cause oxygen near the surface to diffuse through the wafer surface wherein the radiation beam is formed from at least one laser that includes a laser diode with the radiation beam forming an image on the wafer surface;

collecting radiation from the radiation beam that is reflected from the wafer surface where said image is formed; and returning said collected radiation back to the image.

33. A method of forming a denuded zone in an oxygen-containing semiconductor wafer having a body and an unpatterned or substantially unpatterned surface, comprising:

forming a radiation beam from at least one laser that includes a laser diode to form an image on the wafer surface;

scanning a radiation beam over the surface to raise the temperature of each point on the wafer surface to a maximum temperature of at least 1,200° C. for no more than 10 milliseconds to cause oxygen to diffuse out from the wafer surface to form immediately adjacent the wafer surface a shallow oxygen-depleted region having an oxygen concentration insufficient to form oxygen-related precipitates;

collecting radiation from the radiation beam that is reflected from the wafer surface where said image is formed; and returning said collected radiation back to the image.

* * * * *